United States Patent [19]

Usui

[11] Patent Number: 5,598,447
[45] Date of Patent: Jan. 28, 1997

[54] INTEGRATED CIRCUIT DEVICE HAVING INTERNAL FAST CLOCK SOURCE

[75] Inventor: Akira Usui, Hamamatsu, Japan

[73] Assignee: Yamaha Corporation, Hamamatsu, Japan

[21] Appl. No.: 60,733

[22] Filed: May 10, 1993

[30] Foreign Application Priority Data

May 11, 1992 [JP] Japan .................. 4-144898

[51] Int. Cl.⁶ .................. H01L 27/00; H03D 3/24
[52] U.S. Cl. .................. 375/376; 370/516; 326/81; 331/57
[58] Field of Search .................. 375/354, 356, 375/375, 376; 370/105.3; 326/64, 81; 327/147, 156; 331/1 A, 1 R, 17, 25, 57

[56] References Cited

U.S. PATENT DOCUMENTS

| | | | |
|---|---|---|---|
| 4,513,427 | 4/1985 | Borriello et al. .................. | 375/360 |
| 4,596,026 | 6/1986 | Cease et al. .................. | 375/372 |
| 5,099,477 | 3/1992 | Taniguchi et al. .................. | 375/211 |
| 5,233,314 | 8/1993 | McDermott et al. .................. | 331/17 |

*Primary Examiner*—Young T. Tse
*Attorney, Agent, or Firm*—Loeb & Loeb LLP

[57] ABSTRACT

An integrated circuit device is comprised of an input interface, a PLL unit, a processing unit and an output interface. The input interface operates in response to an external clock signal for sequentially receiving input data in synchronization with an external synchro signal. The PLL unit includes an internal clock source operative in phase-locked manner according to the external synchro signal for generating an internal clock signal which is faster than the external clock signal. The processing unit operates in response to the internal clock signal for sequentially processing the input data. The output interface operates in response to the external synchro signal for sequentially outputting the processed data in synchronization with the external synchro signal.

14 Claims, 3 Drawing Sheets

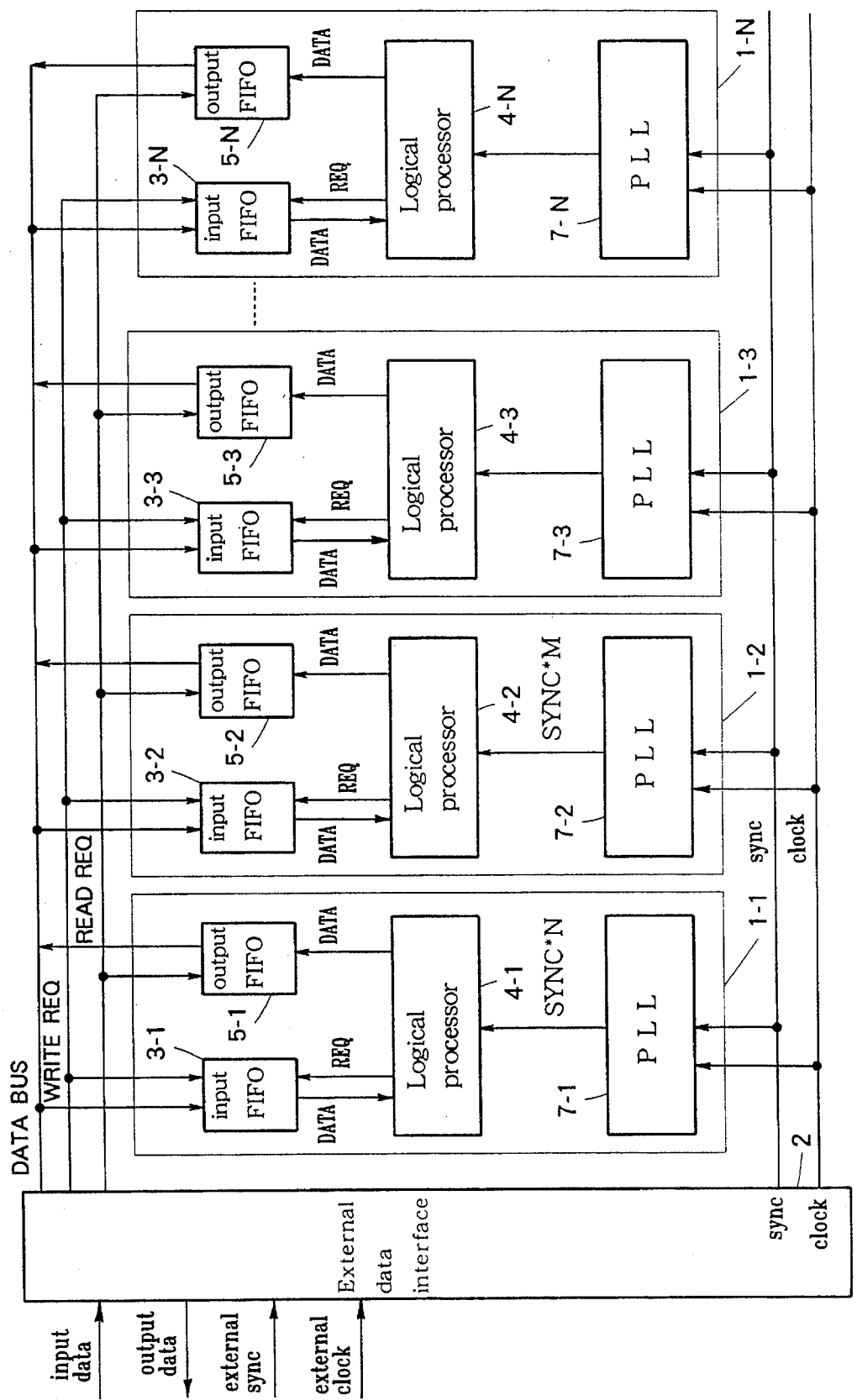

_(5,598,447)_

INTEGRATED CIRCUIT DEVICE HAVING INTERNAL FAST CLOCK SOURCE

BACKGROUND OF THE INVENTION

The present invention relates to an integrated circuit device such as a digital signal processor which is required fast processing of an internal signal.

For example, a digital audio system is comprised of a plurality of large scale integrated circuit devices (LSIs) which utilize a common clock signal for executing certain signal processings. The typical LSI fabricated by current LSI production technology has an operating speed up to 20 MHz–50 MHz. In near future, the operating speed is expected to reach an order of several hundreds MHz. Therefore, the audio system may need a fast clock signal for internal data processing by the LSI, which is far faster than a data sampling frequency of, for example, 44.1 kHz adopted by the audio system.

Generally, a quartz crystal oscillator is utilized as an external clock source for the LSI. The quartz crystal oscillator may generate a clock signal having a frequency up to 100 MHz in practical level. However, common use of such a fast clock signal among plural LSIs may cause various drawbacks. First, it may be practically difficult to transfer such a fast clock signal along a circuit board which supports the plural LSIs. Second, it may be practically difficult to admit the fast clock signal inside the LSI even though the fast clock signal is delivered to a clock input terminal of the LSI. Third, it may be difficult to maintain constantly the phase relation between a system clock signal and an internal clock signal of each LSI.

SUMMARY OF THE INVENTION

In view of the above noted drawbacks of the prior art, an object of the invention is to provide an integrated circuit device having an internal clock source for generating a fast internal clock signal effective to enable fast internal signal processing which is useful for a composite system of plural integrated circuit devices. The inventive integrated circuit device is comprised of an input interface operative in response to a given external clock signal for sequentially receiving given data in synchronization with a given external synchro signal, a PLL unit including an internal clock source operative in phase-locked manner according to the external synchro signal for generating an internal clock signal which is faster than the external clock signal, a processing unit operative in response to the internal clock signal for sequentially processing the received data, and an output interface operative in response to the external clock signal for sequentially transmitting the processed data in synchronization with the external synchro signal.

According to the invention, in contrast to the conventional system in which a fast external clock source is commonly shared by plural LSIs, there is no need to transfer a fast clock signal along a system circuit board. Further, an oscillating frequency of the PLL unit can be suitably selected according to processing scheme of individual LSIs. Constant phase relation can be maintained between the input and output data according to the external synchro signal in terms of a phase of a sampling frequency, while the internal processing unit driven by the fast internal clock signal can be separated for free operation by a buffer such as FIFO from the input and output interfaces driven by the slow external clock signal.

BRIEF DESCRIPTION OF THE DRAWINGS

FIG. 3 is a block diagram showing a construction of a plurality of large scale integrated circuit devices.

DETAILED DESCRIPTION OF THE INVENTION

Figure 1:
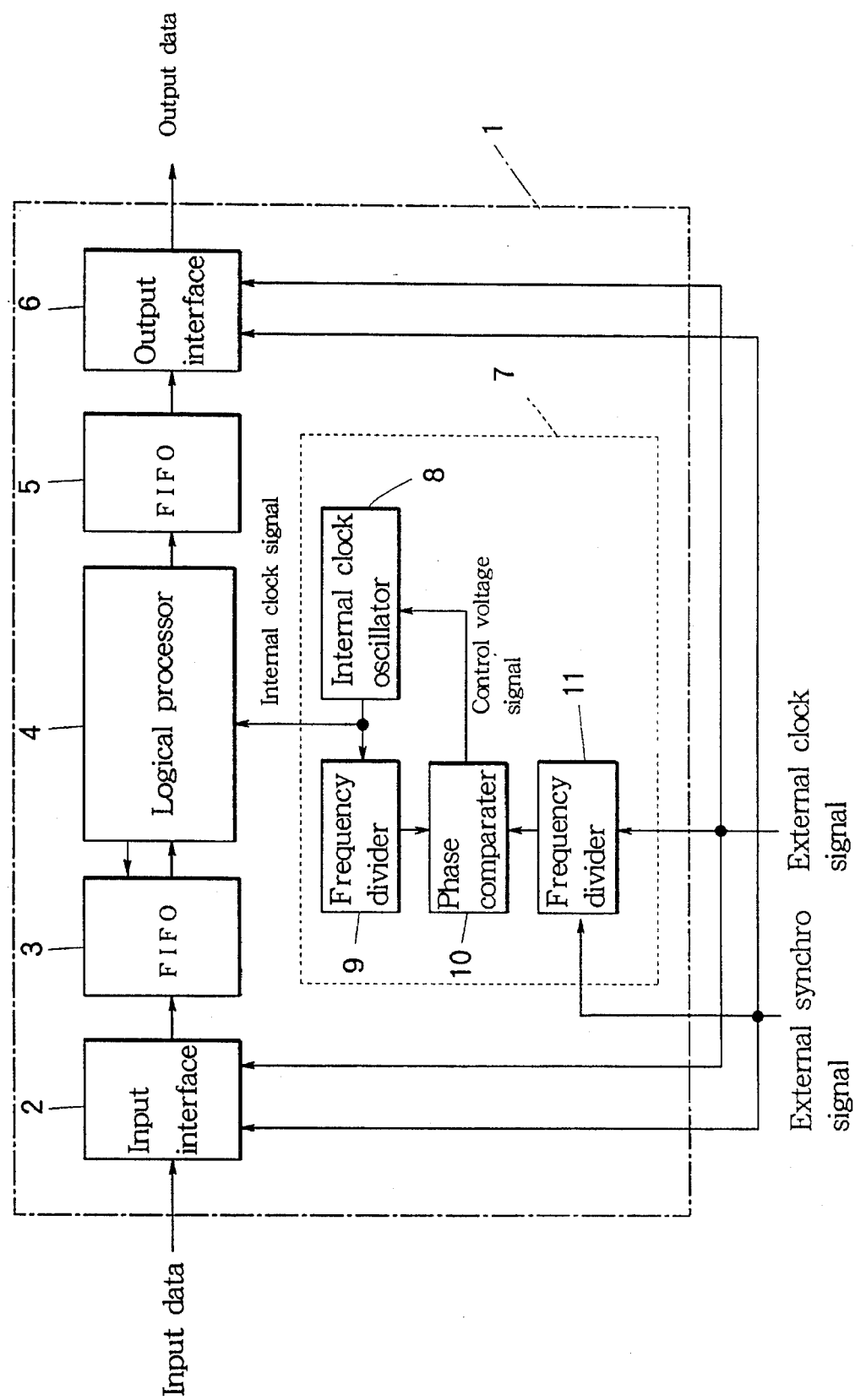
FIG. 1 is a block diagram showing construction of one LSI embodiment according to the invention.

Hereinafter, one embodiment of the present invention will be described in conjunction with the drawings. FIG. 1 is a block diagram showing overall construction of a large scale integrated circuit device (LSI) according to the invention. As shown in the figure, the LSI 1 is formed in a semiconductor chip and functions as a digital signal processor (DSP) for use in, for example, digital processing of an audio signal. The LSI 1 is comprised of an input interface 2, a first-in and first-out (FIFO) buffer 3, a logical processor 4 for digital signal processing, another FIFO 5, an output interface 6, and a phase-locked loop (PLL) unit 7 for generating an internal clock signal. This LSI 1 may be combined with other LSIs to form a digital audio system.

The input and output interfaces 2 and 6 are driven by a given external clock signal in synchronization with a given external synchro signal. The input interface 2 receives input data to be processed by the logical processor 4. For example, the input interface 2 is composed of a serial/parallel converter for sequentially converting the serial input data into parallel data in response to the external clock signal and synchro signal. The clock signal times each bit of the serial data, and the synchro signal times each byte of the parallel data. In turn, the output interface 6 transmits output data processed by the logical processor 4. The output interface 6 is composed of a parallel/serial converter for sequentially converting the processed parallel data into the serial output data in response to the external clock signal and synchro signal. The external clock signal is provided from an external clock source such as an external quartz crystal oscillator having, for example, 44.1×n kHz of oscillating frequency which is commonly used for plural LSIs in the digital audio system including the LSI 1. The external synchro signal may be provided from another LSI as a sampling clock having, for example, 44.1 kHz of frequency which is used for sampling of digital data. The synchro signal has the frequency one-nth of that of the external clock signal, so that the input interface 2 can convert n bits of serial digital data into one byte of parallel digital data in response to the external clock signal and synchro signal.

The PLL unit 7 is composed of an internal clock oscillator 8, a frequency divider 9, a phase comparator 10, and another frequency divider 11, those of which are connected altogether to constitute a phase-locked loop. The internal clock source 8 is composed of a variable frequency oscillator regulated by a control voltage signal for generating locally the internal clock signal which is set faster than the external clock signal. The frequency divider 9 divides the internal clock signal outputted from the internal clock oscillator 8 by a given frequency. The other frequency divider 11 divides the external clock signal in synchronization with the external synchro signal by another given rate such that the divided external clock signal has a frequency comparable to that of the divided internal clock signal. The phase comparator 10 undergoes phase comparison between the divided external and internal clock signals to produce the control voltage signal, which is fed to the variable frequency oscillator 8 so as to effect phase lock of the internal clock signal. Thus, the phase-locked internal clock signal can be synchronized with the external synchro signal while having the frequency faster than that of the external clock signal by a given integer multiple factor.

The logical processor 4 is operated by the fast internal clock signal to process the parallel data, while the input and output interfaces 2, 6 are operated by the external clock signal which is slower than the internal clock signal. In order to absorb jitter caused between the logical processor 4 and either of the input and output interfaces 2, 6 due to the frequency difference between the internal and external clock signals, FIFO buffers 3, 5 are interposed between the logical processor 4 and each of the input and output interfaces 2, 6.

In this embodiment, plural LSIs are mounted on a system circuit board, and they share an external clock source such as a quartz crystal oscillator having a moderate operation speed, while an individual LSI is equipped with an internal clock in the form of the PLL unit 7 having a high operation speed to enable fast data processing. The PLL unit 7 produces the internal clock signal in synchronization with the external synchro signal, while the input and output interfaces 2, 6 are operated in response to the same external synchro signal for undergoing receipt and delivery of the digital data, thereby stably maintaining synchronous relation among the plural LSIs within the system.

Figure 2:
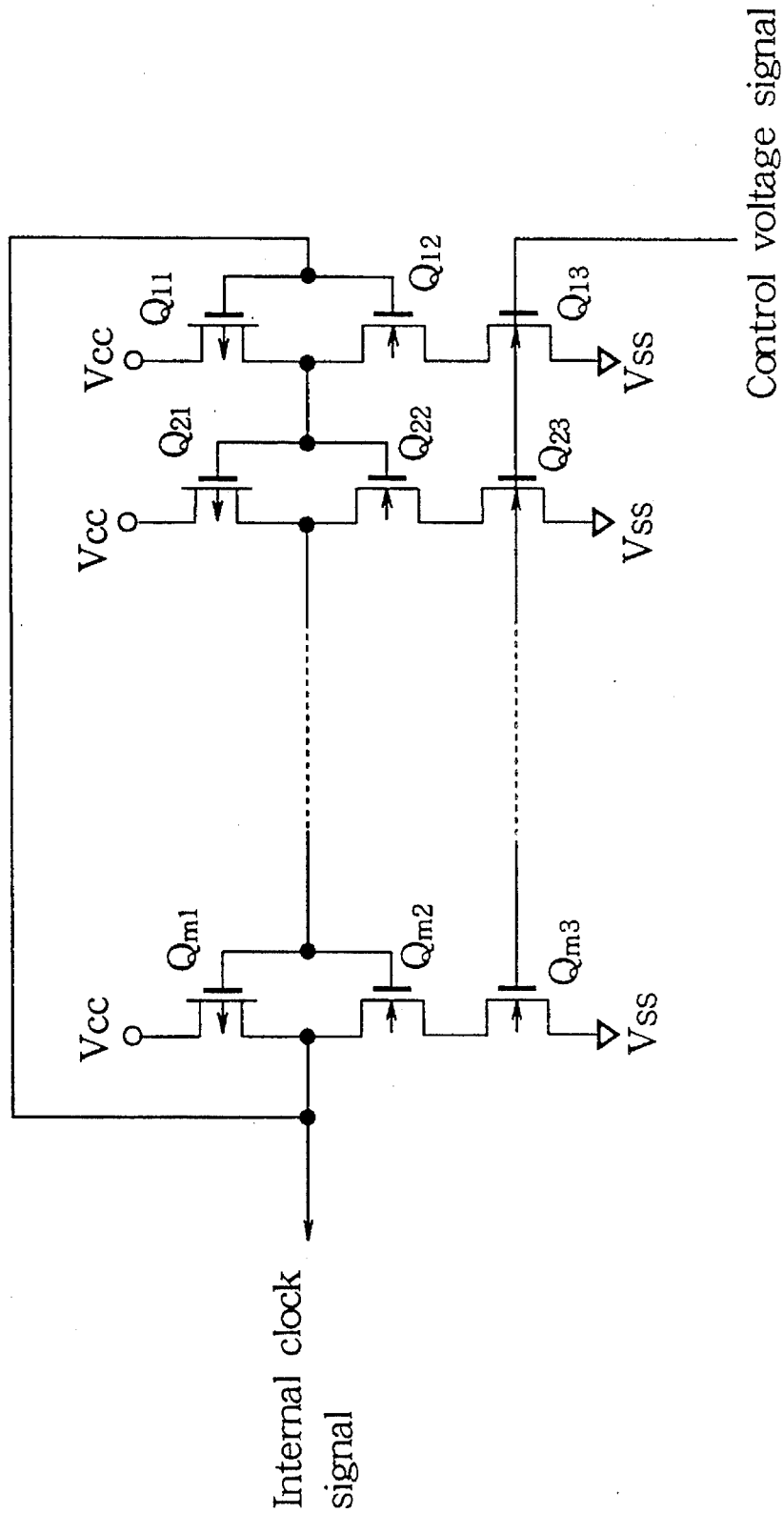
FIG. 2 is a circuit diagram showing an internal clock oscillator within a PLL unit.

Referring to FIG. 2, the internal clock source 8 of the PLL unit 7 is composed of a ring oscillator which includes a chain of m number of CMOS inverters. An i-th CMOS inverter (i=1, 2, ..., m) is comprised of a pair of P channel MOS transistor Qi1 and N channel MOS transistor Qi2. Each CMOS inverter is connected between VCC line and VSS line. Another N channel MOS transistor Qi3 is connected in series to a corresponding CMOS inverter so as to regulate a drive current flowing through the corresponding CMOS inverter according to the control voltage signal fed from the phase comparator 10, thereby variably controlling the oscillating frequency of the internal clock oscillator 8. By such a construction, the internal clock oscillator 8 can generate the fast internal clock signal in synchronization with the external synchro signal.

Another embodiment of the present invention will be described with reference to FIG. 3. FIG. 3 is a block diagram showing a construction of a plurality of large scale integrated circuit devices (LSI), i.e., multi-chip circuits. Ill FIG. 3, each LSI 1—1 through 1-N is formed in a semiconductor chip as a digital signal processor as described before. The function of the LSI is substantially the same as described before. Each of the LSIs is comprised of an input first-in and first-out (FIFO) buffer 3-1 through 3-N, a logical processor 4-1 through 4-N for digital signal processing, an output FIFO buffer 5-1 through 5-N, and a phase-locked loop (PLL) unit 7-1 through 7-N for generating an internal clock signal. An external data interface 2 is driven by a given external clock signal and provides a synchronizing clock signal SYNC to each of the LSI 1-1 through 1-N. The external data interface 2 is connected to a data bus, a write request line WRITE REQ and a read request line READ REQ. The external data interface 2 transfers audio data through the data bus. Each PLL unit 7 generates the internal clock signal of which frequency is higher than the frequency of the external clock signal, in response to synchronizing clock signal SYNC.

The operation of the embodiment will be described hereunder with respect to the LSI 1—1. The audio data on a data bus is written in the input FIFO 3-1 in response to a write request signal WRITE REQ. This write operation is performed based on the external clock signal. The LSI 1—1 generates a data input request signal REQ to the input FIFO 3-1. The input FIFO outputs the data to the logical processor 4-1. The logical processor 4-1 functions based on the internal clock signal which has a higher frequency than the external frequency and which is generated at the PLL circuit 7-1. Then, the processed data is outputted to the output FIFO 5-1. The external data interface outputs a read request signal to the output FIFO 5-1 through the read request line READ REQ. The output FIFO 5-1 outputs the processed data to the data bus in response to the read request signal. Therefore, the output FIFO 5-1 outputs the processed data to the data bus synchronously with the external clock signal. As a result, the processed data synchronizes with the predetermined data timing of the audio data signal.

As described above, according to the invention, the integrated circuit device (LSI) is provided internally with the PLL unit for generating the fast internal clock signal, thereby eliminating transfer of a fast external clock signal among LSIs on the system circuit board which mounts the LSIs. The PLL unit enables the LSI to execute fast internal data processing while maintaining the synchronous relation among the LSIs.

What is claimed is:

1. An integrated circuit device comprising:
   an input interface operative in response to an external clock signal for sequentially receiving data in synchronization with a given external [synchro] synchronization signal;
   a phase-locked loop (PLL) unit [including an internal clock source] operative in phase-locked manner according to the external [synchro] synchronization signal and the external clock signal for generating an internal clock signal which is faster than the external clock signal;
   a processing unit operative in response to the internal clock signal for sequentially processing the received data; and
   an output interface operative in response to the external clock signal and the external synchronization signal for sequentially transmitting the processed data in synchronization with the external synchronization signal and the external clock signal.

2. The integrated circuit device according to claim 1; further comprising an internal clock source, wherein the internal clock source comprises a ring oscillator composed of a chain of complimentary metal-oxide semi-conductor device (CMOS) inverters.

3. The integrated circuit device according to claim 1, further including a buffer interposed between the processing unit and either of the input and output interfaces for absorbing jitter caused by frequency difference between the external and internal clock signals.

4. The integrated circuit device according to claim 1, wherein the PLL unit comprises an internal clock source oscillator controllable by a control voltage signal for generating the internal clock signal having a variable frequency, a divider for frequency-dividing the internal clock signal by a given rate, another divider operative in synchronization with the external synchronization signal for frequency-dividing the external clock signal by another given rate such that divided frequencies of the internal and external clock signals are comparable to each other, and a phase comparator for comparing phases of the frequency-divided internal and external clock signals with each other to thereby produce the control voltage signal effective to phase-lock an oscillating frequency of the internal clock source oscillator according to the external synchronization signal.

5. The integrated circuit device of claim 1, wherein an error signal is determined by comparing the internal clock signal divided by a predetermined frequency with the external clock signal divided by a second predetermined frequency, and wherein the error signal is used in the PLL unit to maintain a phase-locked relationship between the internal clock signal and the external synchronization signal.

6. The integrated circuit device of claim 5, wherein the error signal is supplied as an input to a voltage controlled oscillator.

7. The integrated circuit device of claim 1, wherein said input interface includes at least one section of first-in first-out (FIFO) memory for sequentially receiving data from the input interface and sequentially transmitting data to the processing unit.

8. The integrated circuit device of claim 1, wherein the processing unit performs a digital signal processing function on the received data.

9. The integrated circuit device of claim 1, wherein said output interface includes at least one section of first-in first-out (FIFO) memory for sequentially receiving data from the processing unit and sequentially transmitting data to the output interface.

10. A method of operating an integrated circuit, comprising the steps of:

providing an external synchronization signal to the integrated circuit;

generating an internal clock signal within the integrated circuit that is faster than an external clock signal, said internal clock signal being based on the external synchronization signal and the external clock signal;

operating the integrated circuit by the internal clock signal;

processing data inputted to the integrated circuit based on the internal clock signal; and outputting the processed data based on the external synchronization signal and the external clock signal.

11. The method according to claim 10, wherein a phase-locked loop (PLL) circuit within the integrated circuit is used to generate the internal clock signal.

12. The method according to claim 11, wherein the step of generating the internal clock signal further includes the step of generating the internal clock signal by the PLL circuit based on the external synchronization signal and the external clock signal.

13. The method according to claim 10, further including the step of sequentially inputting data synchronized with the external synchronization signal.

14. The method according to claim 10, further including the step of sequentially outputting the processed data synchronized with the external synchronization signal.

* * * * *

UNITED STATES PATENT AND TRADEMARK OFFICE
CERTIFICATE OF CORRECTION

PATENT NO. : 5,598,447
DATED : January 28, 1997
INVENTOR(S) : Akira Usui

It is certified that error appears in the above-indentified patent and that said Letters Patent is hereby corrected as shown below:

Column 4, line 30, delete "[synchro]".

Column 4, line 32 & 33, delete "[including an internal clock source]".

Column 4, line 34, delete "[synchro]".

Signed and Sealed this

Twenty-first Day of October 1997

Attest:

BRUCE LEHMAN

Attesting Officer

Commissioner of Patents and Trademarks